United States Patent
Wu et al.

(10) Patent No.: US 11,588,457 B2
(45) Date of Patent: Feb. 21, 2023

(54) ANALOG FRONT-END CIRCUIT CAPABLE OF DYNAMICALLY ADJUSTING GAIN

(71) Applicant: REALTEK SEMICONDUCTOR CORP., Hsinchu (TW)

(72) Inventors: Chien-Ming Wu, Hsinchu (TW); Chung-Ming Tseng, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/467,325

(22) Filed: Sep. 6, 2021

(65) Prior Publication Data
US 2022/0231646 A1 Jul. 21, 2022

(30) Foreign Application Priority Data
Jan. 18, 2021 (TW) ................. 110101798

(51) Int. Cl.
*H03G 3/30* (2006.01)
*H03F 1/30* (2006.01)

(52) U.S. Cl.
CPC ............... *H03G 3/30* (2013.01); *H03F 1/30* (2013.01); *H03F 2200/171* (2013.01); *H03G 2201/103* (2013.01)

(58) Field of Classification Search
CPC .. H03G 3/30; H03G 2201/103; H03G 1/0088; H03G 1/0023; H03G 3/3042; H03F 1/30; H03F 2200/171; H03F 2203/45526; H03F 2203/45591; H03F 2203/45631; H03F 3/45475; H03M 1/124; H03M 1/129

USPC .......................................................... 330/278
See application file for complete search history.

(56) References Cited

U.S. PATENT DOCUMENTS

| | | | | |
|---|---|---|---|---|
| 5,757,227 A | * | 5/1998 | McQuaid | H03F 3/082 327/557 |
| 7,545,210 B2 | * | 6/2009 | Hughes | H03F 3/45475 330/254 |
| 8,493,114 B2 | | 7/2013 | Cho et al. | |

(Continued)

FOREIGN PATENT DOCUMENTS

| CN | 101783991 A | 7/2010 |
|---|---|---|
| CN | 102868362 A | 1/2013 |

(Continued)

*Primary Examiner* — Khanh V Nguyen
(74) *Attorney, Agent, or Firm* — Li & Cai Intellectual Property (USA) Office

(57) ABSTRACT

An analog front-end circuit capable of dynamically adjusting gain includes a programmable gain amplifier (PGA) circuit, a sensor, a calculation circuit, a gain coarse control circuit and a gain fine control circuit. The PGA circuit includes an amplifier, a gain coarse adjustment circuit and a gain fine adjustment circuit. The gain coarse adjustment circuit is controlled by a coarse control signal, and a gain is adjusted in a coarse step according to an initial gain. The gain fine adjustment circuit is controlled by a fine control signal in a data mode, and the gain is adjusted in a fine step. The calculation circuit calculates a primary gain adjustment and a secondary gain adjustment. The gain coarse control circuit generates the coarse control signal according to the primary gain adjustment, and the gain fine control circuit generates the fine control signal according to the secondary gain adjustment.

13 Claims, 6 Drawing Sheets

(56) References Cited

U.S. PATENT DOCUMENTS 8,588,289 B2 11/2013 Rane et al.
2010/0172515 A1 7/2010 Kimura

FOREIGN PATENT DOCUMENTS

| CN | 103262419 A | 8/2013 |
| CN | 105469067 B | 4/2017 |

* cited by examiner

ANALOG FRONT-END CIRCUIT CAPABLE OF DYNAMICALLY ADJUSTING GAIN

CROSS-REFERENCE TO RELATED PATENT APPLICATION

This application claims the benefit of priority to Taiwan Patent Application No. 110101798, filed on Jan. 18, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an analog front-end circuit, and more particularly to an analog front-end circuit capable of dynamically adjusting gain, which can avoid drastic changes in a signal-to-noise ratio (SNR) caused by dynamically adjusting the gain.

BACKGROUND OF THE DISCLOSURE

In the existing analog front-end (AFE) system, after receiving an input signal, the input signal will be enlarged or reduced to optimize a signal-to-noise ratio (SNR) while avoiding clipping or saturation of an output signal.

After an initial gain is determined according to signal strength by the AFE system in a handshake mode, the input signal is amplified with the initial gain consistently. If the AFE system is affected by temperature drift, the signal strength will change, which may affect the SNR optimization of the entire AFE system, and even cause clipping or saturation to the output signal, resulting in a sharp drop in the SNR of the AFE system. If a communication system is used as an example, packet loss may occur.

However, if the gain of the AFE system is arbitrarily adjusted under normal operation, various transient responses will be generated during a transition process of the gain and the SNR will change instantaneously. For the communication system, packet loss immediately occurs. Although the SNR optimization can be completed after the AFE system is stabilized, the transient response caused by switching the gain has already caused irreparable packet loss, and if the gain of the AFE system is continuously adjusted dynamically, packet loss continuously occurs.

Therefore, improving a gain adjustment mechanism to avoid drastic changes in the SNR of the AFE system caused by dynamically adjusting the gain has become an important issue to be solved in the arts.

SUMMARY OF THE DISCLOSURE

In response to the above-referenced technical inadequacies, the present disclosure provides an analog front-end circuit capable of dynamically adjusting gain, which can avoid drastic changes in a signal-to-noise ratio (SNR) caused by dynamically adjusting the gain.

In one aspect, the present disclosure provides an analog front-end circuit capable of dynamically adjusting gain, suitable for receiving an input signal from a signal source, the analog front-end circuit includes a programmable gain amplifier circuit, at least one sensor, a calculation circuit, a gain coarse control circuit and a gain fine control circuit. The programmable gain amplifier circuit includes an amplifier, a gain coarse adjustment circuit and a gain fine adjustment circuit. The amplifier is configured to receive and amplify the input signal. The gain coarse adjustment circuit is connected to the amplifier and configured to be controlled by a coarse control signal to adjust a gain of the programmable gain amplifier circuit in a coarse step according to an initial gain determined in a handshake mode. The gain fine adjustment circuit is connected to the amplifier and configured to be controlled by a fine control signal in a data mode after the handshake mode is ended, and adjust the gain of the programmable gain amplifier circuit in a fine step. The at least one sensor is configured to respectively perform sensing in the data mode to generate a sensing signal. The calculation circuit is connected to the at least one sensor and configured to calculate a primary gain adjustment according to the initial gain, and calculate a secondary gain adjustment according to the sensing signal. The gain coarse control circuit is configured to generate the coarse control signal according to the primary gain adjustment. The gain fine control circuit is configured to generate the fine control signal according to the secondary gain adjustment. The coarse step is within a coarse adjustment range, the fine step is within a fine adjustment range, and the coarse adjustment range is larger than the fine adjustment range.

Therefore, in the analog front-end circuit provided by the present disclosure, the calculation circuit can calculate the secondary gain adjustment according to the temperature change when the system changes slightly due to temperature drift, and then the gain fine adjustment circuit can be used to adjust the gain while controlling an adjustment speed thereof, such that burdens of the system under transition conditions can be significantly reduced while the temperature drift issue is solved.

Furthermore, in the analog front-end circuit provided by the present disclosure, when the gain is adjusted by the gain fine control circuit as a system status changes, the gain is switched in an encoding manner different from that of the gain coarse control circuit, which can limit a gain adjustment to a smaller range to reduce the possibility of drastic changes in system SNR when dynamically adjusting the gain.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
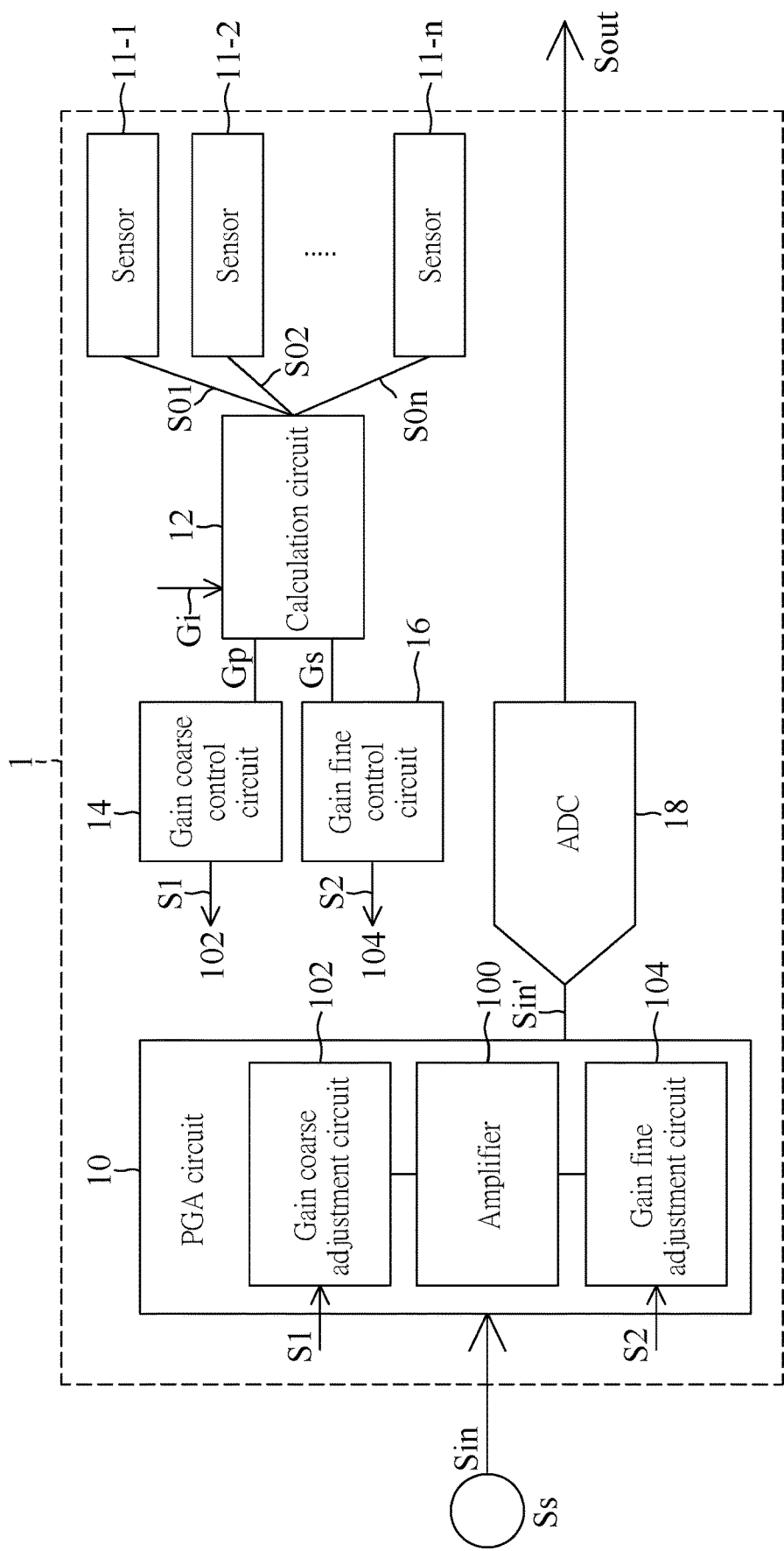
FIG. 1 is a functional block diagram of an analog front-end circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, an embodiment of the present disclosure provides an analog front-end circuit 1 capable of dynamically adjusting gain, suitable for receiving an input signal Sin from a signal source Ss. The analog front-end circuit 1 includes a programmable gain amplifier (PGA) circuit 10 and a plurality of sensors 11-1, 11-2, . . . 11-$n$, a calculation circuit 12, a gain coarse control circuit 14 and a gain fine control circuit 16. In this embodiment, the analog front-end circuit 1 further includes an analog-to-digital converter (ADC) 18.

The PGA circuit 10 is a highly versatile amplifier, and an amplification factor thereof can be controlled as required. The PGA circuit 10 includes an amplifier 100, a gain coarse adjustment circuit 102 and a gain fine adjustment circuit 104.

The amplifier 100 can be used to receive and amplify the input signal Sin, and can be, for example, an operational amplifier. The gain coarse adjustment circuit 102 is connected to the amplifier 100, and is configured to be controlled by a coarse control signal S1, and adjust the gain of the PGA circuit 10 in a coarse step according to an initial gain Gi determined in a handshake mode.

On the other hand, the gain fine adjustment circuit 104 is connected to the amplifier 100, and is configured to be controlled by a fine control signal S2 in a data mode after the handshake mode is ended, and adjust the gain of the PGA circuit 10 in a fine step.

For example, an electronic device including the PGA circuit 10 can perform the handshake mode in advance with an electronic device including the signal source Ss, the two electronic devices can determine an initial gain to be used by detecting signal strengths of each other, and enter the data mode accordingly to transfer data.

However, if a status of the AFE system is changed, for example, affected by temperature drift, resulting in a change in signal strength, at this time, the sensors 11-1, 11-2, . . . 11-$n$ in the present disclosure are configured to perform sensing in the data mode, and generate sensing signals S01, S02, . . . S0$n$ according to sensing results. For example, the sensors 11-1, 11-2, . . . , 11-$n$ can include a temperature sensor for sensing the system temperature.

The calculation circuit 12 is connected to the sensors 11-1, 11-2, . . . 11-$n$, and is configured to calculate a primary gain adjustment Gp based on the initial gain Gi, and calculate a secondary gain adjustment Gs based on the sensing signals S01, S02, . . . S0$n$. In detail, both the gain coarse adjustment circuit 102 and the gain fine adjustment circuit 104 of the present disclosure have a gain adjustment mechanism. The difference is that the gain coarse adjustment circuit 102 bears most of a gain range, while the gain fine adjustment circuit 104 is responsible for a small part of the gain range. In other words, the coarse step can be within a coarse adjustment range, the fine step can be within a fine adjustment range, and the coarse adjustment range is larger than the fine adjustment range. Therefore, the calculation circuit 12 can calculate the secondary gain adjustment Gs according to the temperature change when the system changes slightly due to temperature drift, and then the gain fine adjustment circuit 104 can be used to adjust the gain while controlling an adjustment speed thereof, such that burdens of the system under transition conditions can be significantly reduced while solving the temperature drift issues.

In addition, the gain coarse control circuit 14 is configured to generate the coarse control signal S1 according to the primary gain adjustment Gp, and the gain fine control circuit 16 is configured to generate the fine control signal S2 according to the secondary gain adjustment Gs, thereby enabling the PGA circuit 10 to output an amplified input signal Sin'.

The ADC 18 then performs analog-to-digital conversion on the amplified input signal Sin' to generate an output signal Sout.

Figure 2:
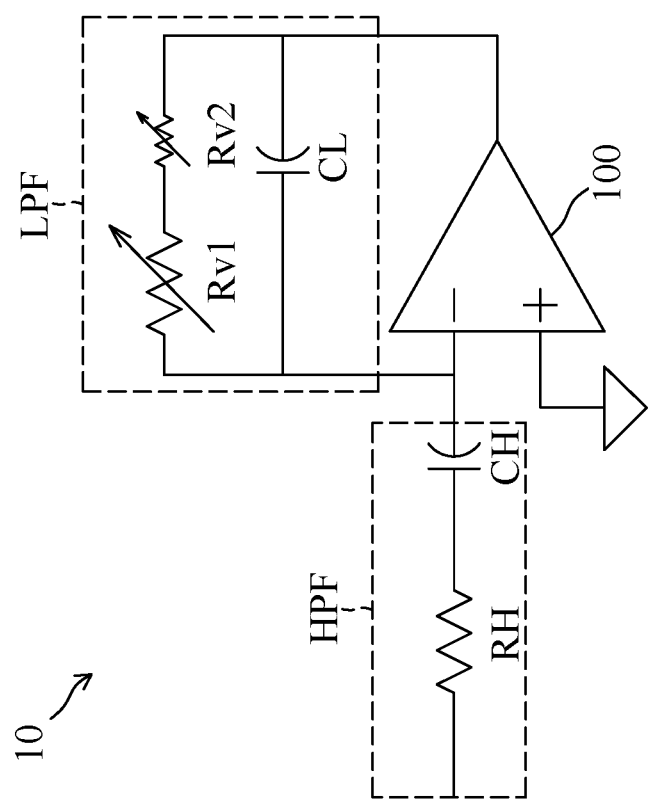
FIGS. 2 to 5 are respectively first to fourth circuit layout diagrams of a programmable gain amplifier circuit according to an embodiment of the present disclosure.

Reference is made to FIGS. 2 to 5, which are respectively first to fourth circuit layout diagrams of a PGA circuit according to an embodiment of the present disclosure. As shown in FIG. 2, the PGA circuit 10 can further include a low-pass filter LPF and a high-pass filter HPF. The low-pass filter LPF is connected between a first input terminal (for example, a negative input terminal as shown in FIG. 2) and an output terminal of the amplifier 100, and the high-pass filter HPF is connected to the first input terminal of the amplifier 100 (for example, the negative input terminal as shown in FIG. 2). A second input terminal of the amplifier 100 (for example, a positive input terminal as shown in FIG. 2) is grounded.

In an embodiment of FIG. 2, the low-pass filter LPF can include a first variable resistor circuit Rv1, a second variable resistor circuit Rv2, and a low-pass capacitor CL, and the high-pass filter HPF includes a high-pass resistor RH and a high-pass capacitor CH. It should be noted that the gain coarse adjustment circuit 102 can be the first variable resistor circuit Rv1 in the low-pass filter LPF, and the fine gain adjustment circuit 104 is the second variable resistor circuit Rv2 in the low-pass filter LPF, and the first variable resistor circuit Rv1 and the second variable resistor circuit Rv2 are respectively controlled by the aforementioned coarse control signal S1 and fine control signal S2, and the first variable resistor circuit Rv1 and the second variable resistor circuit Rv2 are connected in series. Therefore, by controlling a resistance of the second variable resistor circuit Rv2 by the fine control signal S2, a resistance of the low-pass filter LPF located on a negative feedback path of the amplifier 100 can be controlled, thereby adjusting the gain of the PGA circuit 10.

Figure 3:
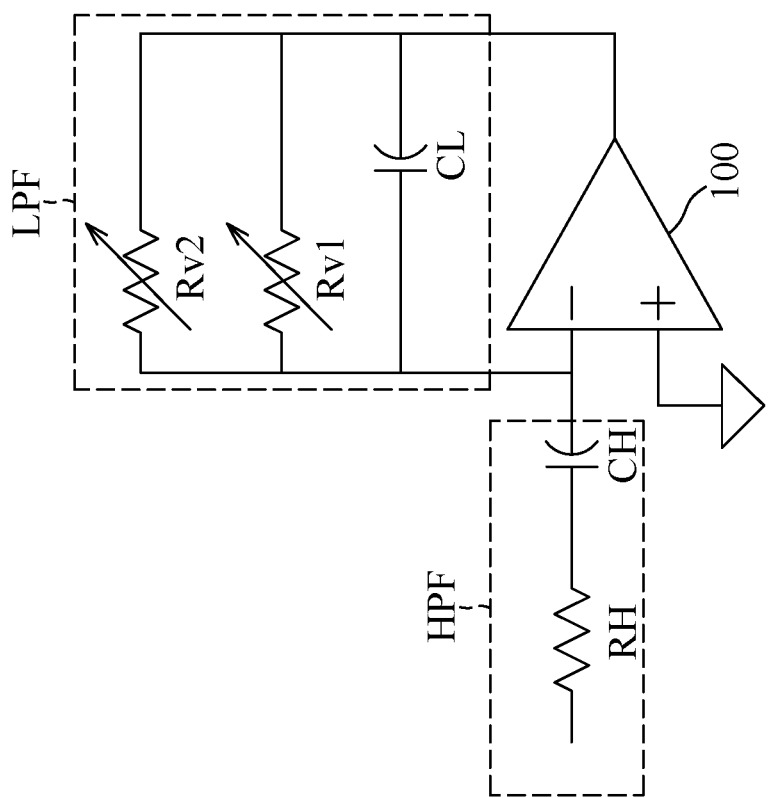

In the embodiment of FIG. 3, a structure of the PGA circuit 10 is basically the same as that shown in FIG. 2, except that the first variable resistor circuit Rv1 and the second variable resistor circuit Rv2 are connected in parallel. Therefore, by controlling a resistance of the second variable resistor circuit Rv2 by the fine control signal S2, a resistance of the low-pass filter LPF located on a negative feedback path of the amplifier 100 can be controlled, thereby adjusting the gain of the PGA circuit 10.

Figure 4:
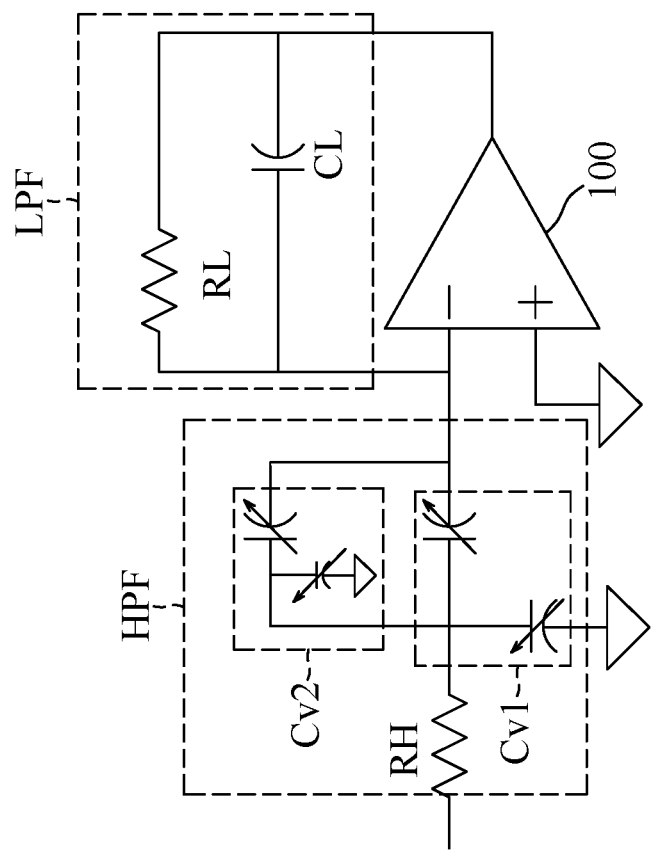

As shown in FIG. 4, the PGA circuit 10 also includes the low-pass filter LPF and the high-pass filter HPF. The low-pass filter LPF is connected between the first input terminal (for example, the negative input terminal as shown in FIG. 2) and the output terminal of the amplifier 100, and the high-pass filter HPF is connected to the first input terminal of the amplifier 100 (for example, the negative input terminal as shown in FIG. 2).

In the embodiment of FIG. 4, the low-pass filter LPF can include a low-pass resistor RL and a low-pass capacitor CL, and the high-pass filter HPF includes a first variable capacitor circuit Cv1, a second variable capacitor circuit Cv2, and a high-pass resistor RH. It should be noted that the gain coarse adjustment circuit 102 can be the first variable capacitor circuit Cv1 in the high-pass filter HPF, and the gain fine adjustment circuit 104 can be the second variable capacitor circuit Cv2 in the high-pass filter HPF, and the first variable capacitor circuit Cv1 and the second variable capacitor circuit Cv2 are controlled by the aforementioned coarse control signal S1 and fine control signal S2, respectively. Therefore, a capacitance of the high-pass filter HPF of the amplifier 100 can be controlled by the fine control signal S2, such that the gain of the PGA circuit 10 is adjusted.

Figure 5:
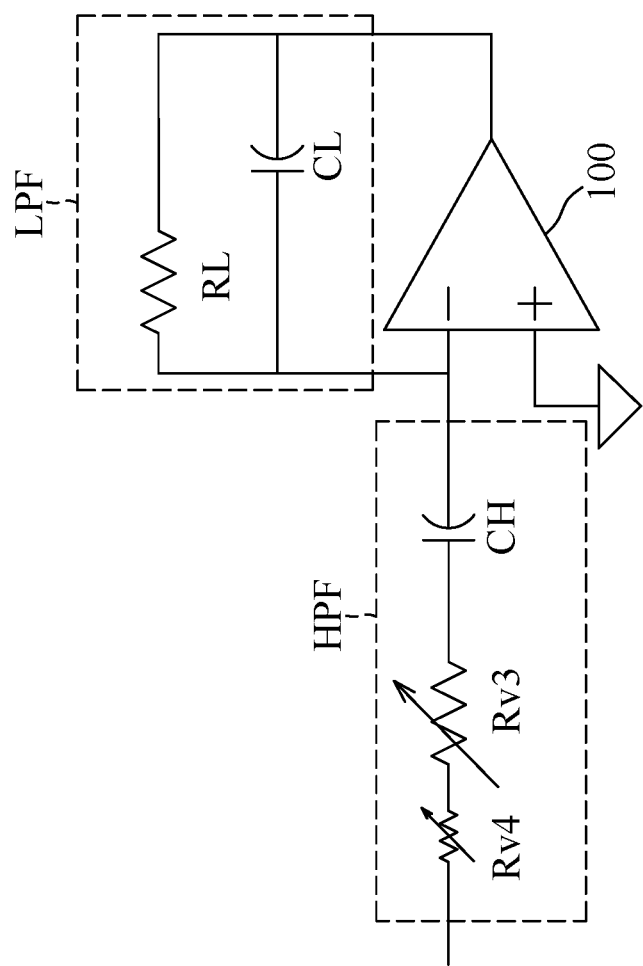

In the embodiment of FIG. 5, a structure of the PGA circuit 10 is basically the same as that shown in FIG. 4, except that the high-pass filter HPF includes a third variable resistor circuit Rv3, a fourth variable resistor circuit Rv4 and a high-pass capacitor CH. In this embodiment, the gain coarse adjustment circuit 102 is the third variable resistor circuit Rv3 in the high-pass filter HPF, and the gain fine adjustment circuit 104 is the fourth variable resistor circuit Rv4 in the high-pass filter HPF.

It should be noted that the variable resistor circuit and the variable resistor circuit mentioned above as the gain coarse adjustment circuit 102 and the gain fine adjustment circuit 104 can include a plurality of switching elements, thereby switching the overall resistance of the variable resistor circuit or the overall capacitance of the variable capacitor circuit, and the switching elements can be controlled in a binary system.

For example, when the gain coarse control circuit 14 and the gain fine control circuit 16 both use the binary system to generate the coarse control signal S1 and the fine control signal S2, taking an adjustment of the capacitance of the high-pass filter HPF in FIG. 4 as an example, ratios of capacitances to be switched are listed as follows:

setting that the gain coarse control circuit 14 can switch 5B, corresponding to 512:256:128:64:32;

setting that the gain fine control circuit 16 can switch 6b, corresponding to 64:32:16:8:4:2;

therefore, a total switchable capacitance value of the coarse gain control circuit 14 is:

512+256+128+64+32=992, that is, 992 units.

On the other hand, a total switchable capacitance value of the gain fine control circuit 16 is:

64+32+16+8+4+2=126, that is, 126 units.

Therefore, the aforementioned coarse adjustment range is 992 units, and the coarse step is within 992 units. On the other hand, the fine step is within the fine adjustment range, that is, 126 units, and the coarse adjustment range (992) is greater than the fine adjustment range (126). During the switching, an instantaneous maximum switchable fine step (that is, the switchable capacitance) of the gain fine control circuit 16 can be switched from 011111 to 100000, and a total of 126 units are switchable. Therefore, since the gain fine control circuit 16 is used to adjust the gain as a system status changes, a gain adjustment can be limited to a smaller range to reduce the possibility of drastic changes in system SNR when dynamically adjusting the gain.

In other embodiments, the gain coarse control circuit 14 and the gain fine control circuit 16 can also be coded in different ways. For example, the gain fine control circuit 16 can utilize a thermometer coding.

Similarly, in this case, ratios of capacitances to be switched are listed as follows:

setting that the gain coarse control circuit 14 can switch 5B, corresponding to 512:256:128:64:32;

setting that the gain fine control circuit 16 can switch 64T, corresponding to 2*63;

therefore, a total switchable capacitance value of the coarse gain control circuit 14 is:

512+256+128+64+32=992, that is, 992 units.

On the other hand, the total switchable capacitance value of the gain fine control circuit 16 is:

2*63=126, that is, 126 units.

However, when using the thermometer coding, the gain fine control circuit 16 only allows the maximum adjustment limit, for example, 2 units, in one adjustment cycle (for example, based on a system clock +1). Therefore, each adjustment is allowed to be smaller, such that an instantaneous burden on the system is reduced, and the probability of drastic changes in SNR is further reduced.

It should be noted that although the binary system and thermometer coding are used in the above embodiments, the present disclosure is not limited thereto, and Gray code can also be used to adjust the gain in a similar manner.

Figure 6:
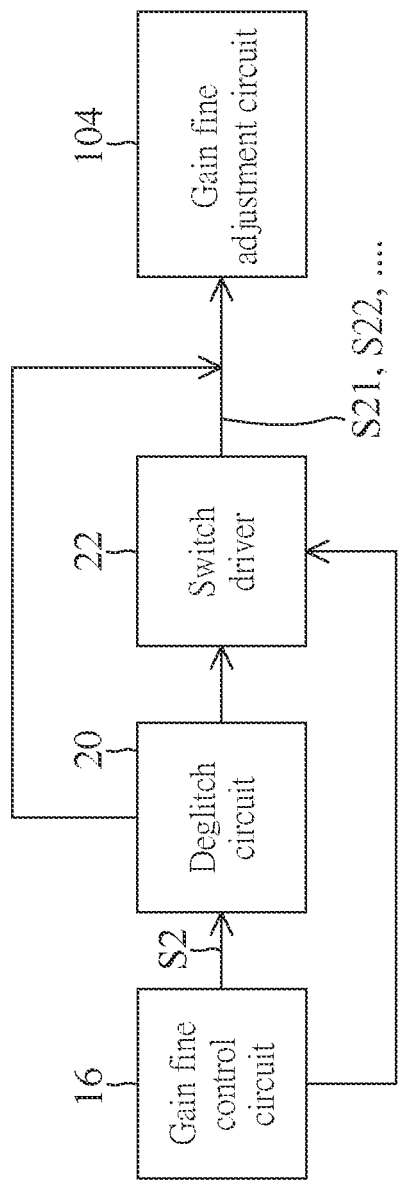
FIG. 6 is a detailed block diagram of a gain fine control circuit and a gain fine adjustment circuit according to an embodiment of the present disclosure.

In addition to the above encoding manners, circuit leveling technique can also be used to reduce an impact on the system when switching the gain. Reference can be further made to FIG. 6, which is a detailed block diagram of a gain fine control circuit and a gain fine adjustment circuit according to an embodiment of the present disclosure. As shown in FIG. 6, the analog front-end circuit 1 can further include a deglitch circuit 20 and a switch driver 22.

The deglitch circuit 20 is connected between the gain fine adjustment circuit 104 and the gain fine control circuit 16, and is configured to remove noise from the fine control signal S2. The deglitch circuit 20 can be, for example, a D flip-flop (DFF), which can adjust the fine control signal S2 according to a system clock and eliminate noise that may be generated, and can allow the ADC 18 at a back-end to be able to sample at the best position when performing the analog-to-digital conversion.

On the other hand, the switch driver 22 can be connected between the gain fine adjustment circuit 104 and the gain fine control circuit 16, and is configured to generate a fine control signal set according to the fine control signal S2, and the fine control signal set includes a plurality of control signals S21, S22, and so on. Here, the switch driver 22 can not only coordinate the control signals S21, S22, and so on, such that the corresponding switching element in the gain fine adjustment circuit 104 is not mistakenly turned on during the switching process. Further, the switch driver 22 can also ensure that a ground terminal of the gain fine adjustment circuit 104 and the first input terminal (that is, the negative input terminal) of the amplifier 100 are not turned on at the same time, thereby avoiding a short circuit.

It should be noted that the deglitch circuit 20 and the switch driver 22 can be used at the same time as shown in FIG. 6, or only one of them is used, but the present disclosure is not limited thereto. Furthermore, functions of the calculation circuit 12, the gain coarse control circuit 14, the gain fine control circuit 16, and the switch driver 22 mentioned in the foregoing embodiments can all be realized by one or more processing units, microcontrollers, microprocessors and/or digital signal processors, and all the aforementioned circuits can be realized in the form of hardware, software, or firmware.

Therefore, in the analog front-end circuit provided by the present disclosure, the calculation circuit can calculate the secondary gain adjustment according to the temperature change when the system changes slightly due to temperature drift, and then the gain fine adjustment circuit can be used to adjust the gain while controlling an adjustment speed thereof, such that burdens of the system under transition conditions can be significantly reduced while solving the temperature drift issues.

Furthermore, in the analog front-end circuit provided by the present disclosure, when the gain is adjusted by the gain fine control circuit as a system status changes, the gain is switched in an encoding manner different from that of the gain coarse control circuit, which can limit a gain adjustment to a smaller range to reduce the possibility of drastic changes in system SNR when dynamically adjusting the gain.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An analog front-end circuit capable of dynamically adjusting gain, adapted to receive an input signal from a signal source, the analog front-end circuit comprising:
    a programmable gain amplifier circuit, including:
        an amplifier configured to receive and amplify the input signal;
        a gain coarse adjustment circuit connected to the amplifier and configured to be controlled by a coarse control signal to adjust a gain of the programmable gain amplifier circuit in a coarse step according to an initial gain determined in a handshake mode; and
        a gain fine adjustment circuit connected to the amplifier and configured to be controlled by a fine control signal in a data mode after the handshake mode is ended, and adjust the gain of the programmable gain amplifier circuit in a fine step;
    at least one sensor configured to respectively perform sensing in the data mode to generate a sensing signal;
    a calculation circuit connected to the at least one sensor and configured to calculate a primary gain adjustment according to the initial gain, and calculate a secondary gain adjustment according to the sensing signal;
    a gain coarse control circuit configured to generate the coarse control signal according to the primary gain adjustment; and
    a gain fine control circuit configured to generate the fine control signal according to the secondary gain adjustment,
    wherein the coarse step is within a coarse adjustment range, the fine step is within a fine adjustment range, and the coarse adjustment range is larger than the fine adjustment range.

2. The analog front-end circuit according to claim 1, wherein the gain fine control circuit utilizes a binary system to generate the fine control signal to control the fine step of the gain fine adjustment circuit.

3. The analog front-end circuit according to claim 1, wherein the gain fine control circuit utilizes a thermometer coding to generate the fine control signal to control the fine step of the gain fine adjustment circuit.

4. The analog front-end circuit according to claim 3, wherein, when the gain fine adjustment circuit adjusts the gain of the programmable gain amplifier circuit with the fine step, the gain fine adjustment circuit has a maximum adjustment limitation in an adjustment cycle.

5. The analog front-end circuit according to claim 1, wherein the programmable gain amplifier circuit includes:
    a low-pass filter connected between a first input terminal and an output terminal of the amplifier; and
    a high-pass filter connected to the first input terminal of the amplifier.

6. The analog front-end circuit according to claim 5, wherein the gain coarse adjustment circuit is a first variable resistor circuit of the low-pass filter, and the gain fine adjustment circuit is a second variable resistor circuit of the low-pass filter.

7. The analog front-end circuit according to claim 6, wherein the first variable resistor circuit and the second variable resistor circuit are connected in series or in parallel.

8. The analog front-end circuit according to claim 5, wherein the gain coarse adjustment circuit is a first variable capacitor circuit of the high-pass filter, and the gain fine adjustment circuit is a second variable capacitor circuit of the high-pass filter.

9. The analog front-end circuit according to claim 5, wherein the gain coarse adjustment circuit is a third variable resistor circuit of the high-pass filter, and the gain fine adjustment circuit is a fourth variable resistor circuit of the high-pass filter.

10. The analog front-end circuit according to claim 1, wherein the at least one sensor include a temperature sensor configured to sense a system temperature, and the calculation circuit calculates the secondary gain adjustment according to the system temperature.

11. The analog front-end circuit according to claim 1, further comprising a deglitch circuit connected between the gain fine adjustment circuit and the gain fine control circuit, and configured to remove noise from the fine control signal.

12. The analog front-end circuit according to claim 1, wherein the gain fine adjustment circuit includes a plurality of switching elements, and the analog front-end circuit further comprises a switch driver connected between the gain fine adjustment circuit and the gain fine control circuit, and the switch driver is configured to generate a fine control signal set according to the fine control signal.

13. The analog front-end circuit according to claim 1, further comprising an analog-to-digital converter configured to convert an amplified input signal from analog to digital to generate an output signal.

\* \* \* \* \*